United States Patent
Goden

(10) Patent No.: US 11,201,180 B2
(45) Date of Patent: Dec. 14, 2021

(54) PHOTOELECTRIC CONVERSION APPARATUS AND PHOTOELECTRIC CONVERSION SYSTEM

(71) Applicant: CANON KABUSHIKI KAISHA, Tokyo (JP)

(72) Inventor: Tatsuhito Goden, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 55 days.

(21) Appl. No.: 16/879,241

(22) Filed: May 20, 2020

(65) Prior Publication Data

US 2020/0373337 A1 Nov. 26, 2020

(30) Foreign Application Priority Data

May 23, 2019 (JP) .............................. JP2019-097164

(51) Int. Cl.
*H01L 27/146* (2006.01)

(52) U.S. Cl.
CPC .. *H01L 27/14603* (2013.01); *H01L 27/14643* (2013.01)

(58) Field of Classification Search
CPC ........ H01L 27/14603; H01L 27/14643; H04N 5/3698
See application file for complete search history.

(56) References Cited

U.S. PATENT DOCUMENTS

| 2009/0152470 | A1 | 6/2009 | Dupont |  |
|---|---|---|---|---|
| 2012/0153131 | A1* | 6/2012 | Ishimoto | H04N 5/3591 |
|  |  |  |  | 250/208.1 |
| 2015/0326812 | A1* | 11/2015 | Sakuragi | H04N 5/37457 |
|  |  |  |  | 250/208.1 |
| 2018/0139396 | A1 | 5/2018 | Totsuka |  |

FOREIGN PATENT DOCUMENTS

| JP | 2001-69404 A | 3/2001 |
| JP | 2014-78869 A | 5/2014 |

* cited by examiner

*Primary Examiner* — Thanh Luu
(74) *Attorney, Agent, or Firm* — Canon U.S.A., Inc. IP Division

(57) ABSTRACT

A photoelectric conversion apparatus includes a plurality of photoelectric conversion units. Each of the plurality of photoelectric conversion units includes a photoelectric conversion element, a first amplification transistor, and a load transistor. Each of a first control unit and a second control unit includes a connection transistor including a gate and a drain connected to the gate, a reference current source and a first switch. The gate of the connection transistor of the first control unit is connected to each gate of the plurality of load transistors corresponding to the plurality of photoelectric conversion elements disposed in a first row. The gate of the connection transistor of the second control unit is connected to each gate of the plurality of load transistors corresponding to the plurality of photoelectric conversion elements disposed in a second row.

19 Claims, 13 Drawing Sheets

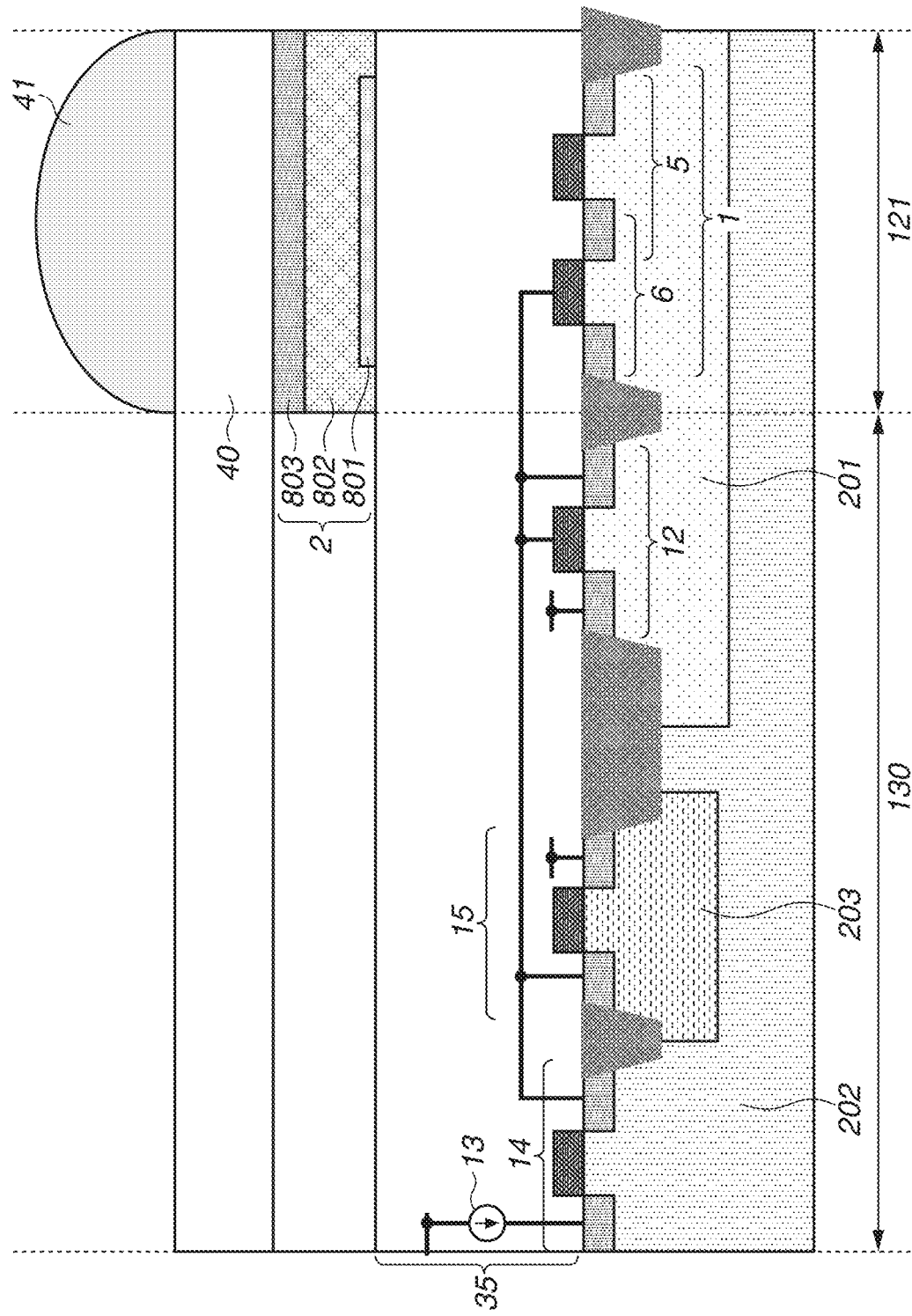

PHOTOELECTRIC CONVERSION APPARATUS AND PHOTOELECTRIC CONVERSION SYSTEM

BACKGROUND

Field

The present disclosure relates to a photoelectric conversion apparatus.

Description of the Related Art

Japanese Patent Application Laid-Open No. 2014-78869 discusses a pixel unit that includes a photoelectric conversion unit and a switch element. The photoelectric conversion unit includes a photoelectric conversion layer and an amplification transistor that outputs a signal voltage based on a charge generated by the photoelectric conversion layer. The switch element performs on/off control on a current source that drives the amplification transistor. According to Japanese Patent Application Laid-Open No. 2014-78869, since the pixel unit includes the switch element, on/off of the current source can be controlled, and accordingly, power consumption can be reduced.

However, Japanese Patent Application Laid-Open No. 2014-78869 is silent on an a desirable arrangement of the switch element and the current source in a case where a plurality of photoelectric conversion units is included. Specifically, according to Japanese Patent Application Laid-Open No. 2014-78869, in the case where a plurality of photoelectric conversion units is included, the same number of switch elements and current sources as the number of photoelectric conversion units are disposed. Thus, as the number of photoelectric conversion units is increased, the size of a photoelectric conversion apparatus also increases.

SUMMARY

According to an aspect of the present disclosure, a photoelectric conversion apparatus includes a plurality of photoelectric conversion units disposed in a row direction and a column direction. Each of the plurality of photoelectric conversion units includes a photoelectric conversion element, a first amplification transistor configured to output a signal voltage based on a charge of the photoelectric conversion element, and a load transistor configured to supply a current to the first amplification transistor. A first control unit is disposed correspondingly to the plurality of photoelectric conversion elements disposed in a first row. A second control unit is disposed correspondingly to the plurality of photoelectric conversion elements disposed in a second row. Each of the first control unit and the second control unit includes a connection transistor, a reference current source, and a first switch. The connection transistor includes a gate and a drain connected to the gate. The reference current source is connected to the connection transistor and configured to supply the current of the load transistor. The first switch is connected to the connection transistor and the reference current source and configured to control a current value of a current flowing in the connection transistor. The gate of the connection transistor of the first control unit is connected to each gate of the plurality of load transistors corresponding to the plurality of photoelectric conversion elements disposed in the first row. The gate of the connection transistor of the second control unit is connected to each gate of the plurality of load transistors corresponding to the plurality of photoelectric conversion elements disposed in the second row.

Further features of the present disclosure will become apparent from the following description of exemplary embodiments with reference to the attached drawings.

BRIEF DESCRIPTION OF THE DRAWINGS

FIG. 4 is a cross-sectional view illustrating the photoelectric conversion apparatus according to the first exemplary embodiment.

DESCRIPTION OF THE EMBODIMENTS

Figure 1:
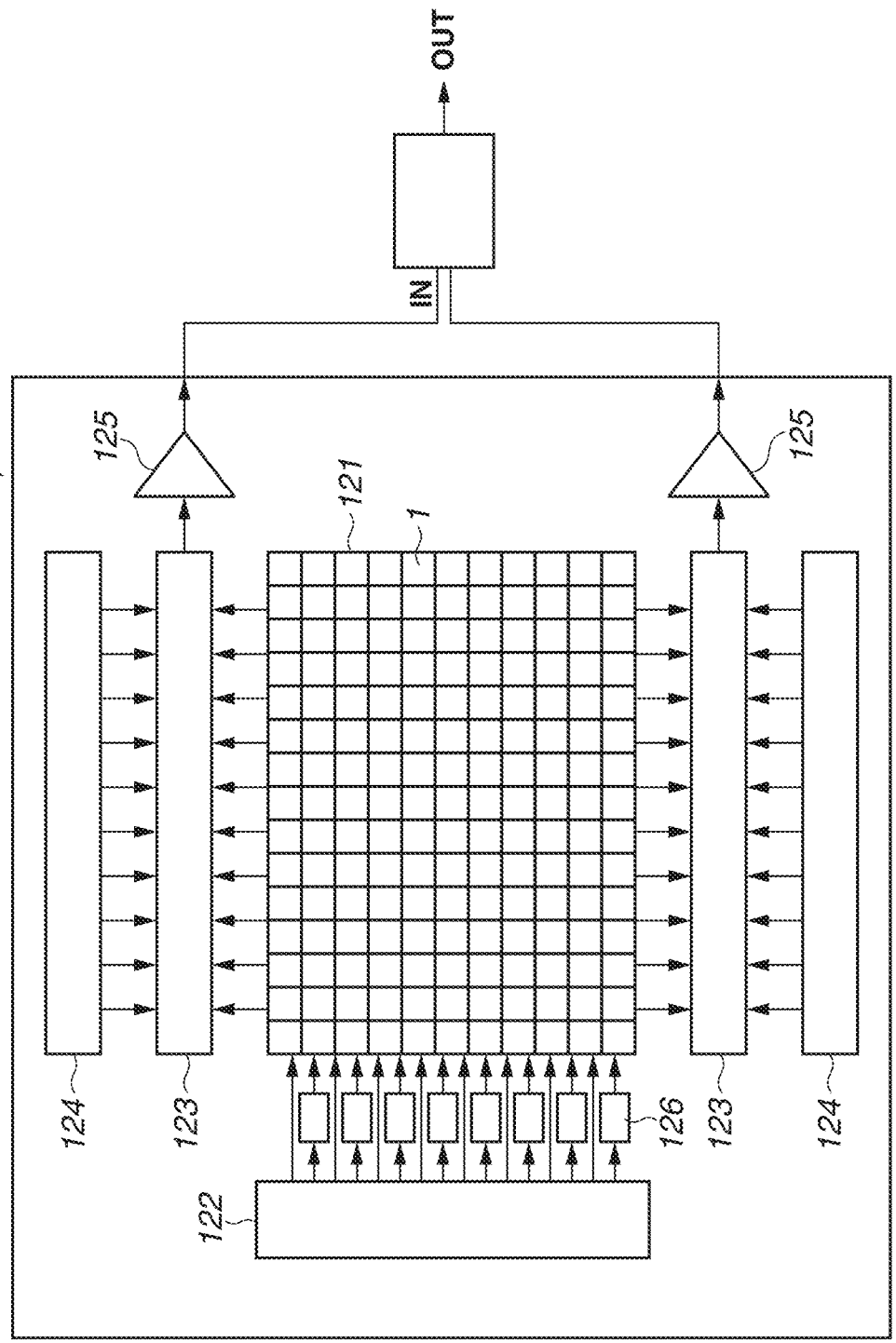
FIG. 1 is a block diagram illustrating a photoelectric conversion apparatus according to a first exemplary embodiment.

Exemplary embodiments described herein are to embody the technical concept of the present disclosure and are not intended to limit the scope of the present disclosure. A size or positional relationship of a component is sometimes exaggeratedly illustrated in the drawings to clarify a description. In the specification, similar configurations are given the same reference numeral, and description thereof is omitted.

As used herein, the term "signal charge" (signal carrier) refers to an electron. A semiconductor region of a first conductivity-type where a carrier having a first polarity that is the same as the polarity of the signal carrier is a majority carrier is an N-type semiconductor region, whereas a semiconductor region of a second conductivity-type where a carrier having a second polarity is a majority carrier is a P-type semiconductor region. Even in a case where the signal carrier is a hole, the present disclosure is still implementable. In this case, the semiconductor region of the first conductivity-type is a P-type semiconductor region, whereas the semiconductor region of the second conductivity-type is an N-type semiconductor region.

In the specification, elements or circuits that have a similar function are given the same reference numeral, and different alphabetical characters are appropriately added as suffixes to the end of the reference numeral to discriminate the elements or circuits. In a case where it is unnecessary to describe the elements or circuits as different elements or circuits, the suffixes such as "a" and "b" are omitted, and a common feature will be described.

A photoelectric conversion apparatus 100 according to a first exemplary embodiment of the present disclosure will be described below with reference to FIGS. 1 to 9.

FIG. 1 is a block diagram illustrating a schematic configuration of the photoelectric conversion apparatus 100. The photoelectric conversion apparatus 100 includes a sensing region 121 and a circuit region. The circuit region includes a vertical scan circuit 122, a reading circuit 123, a horizontal scan circuit 124, an output circuit 125, and a control unit 126.

The sensing region 121 includes a plurality of photoelectric conversion units 1 that is disposed in a two-dimensional (2-D) array in a plurality of rows in a row direction and a plurality of columns in a column direction. Each of the plurality of photoelectric conversion units 1 includes at least one photoelectric conversion element 2 and an amplification transistor 5. The amplification transistor 5 outputs a signal voltage based on a charge of the photoelectric conversion element 2. Each photoelectric conversion unit 1 includes the photoelectric conversion element 2 and a circuit group that includes at least the amplification transistor 5 and a load transistor 6. The load transistor 6 constitutes part of a current source. The sensing region 121 refers to a region where the plurality of photoelectric conversion elements 2 is repeatedly disposed.

The vertical scan circuit 122 is a circuit unit that supplies a control signal for driving the circuit group of the photoelectric conversion unit 1 to the circuit group at the time of reading a signal from the photoelectric conversion unit 1. The reading circuit 123 is a circuit unit that performs signal processing, such as amplification processing and addition processing, on the signal read from the photoelectric conversion unit 1. The reading circuit 123 may further include, for example, a differential amplification circuit, a sample holding circuit, and an analog/digital (AD) conversion circuit. The horizontal scan circuit 124 supplies a control signal to the reading circuit 123 so that the signal processed by the reading circuit 123 is sequentially transferred column by column to the output circuit 125. The output circuit 125 is includes, for example, a buffer amplifier and a differential amplifier and outputs a pixel signal read from the reading circuit 123 to a signal processing unit outside the photoelectric conversion apparatus 100. The control unit 126 controls a current that is supplied to the plurality of photoelectric conversion units 1 of the sensing region 121.

Figure 2:
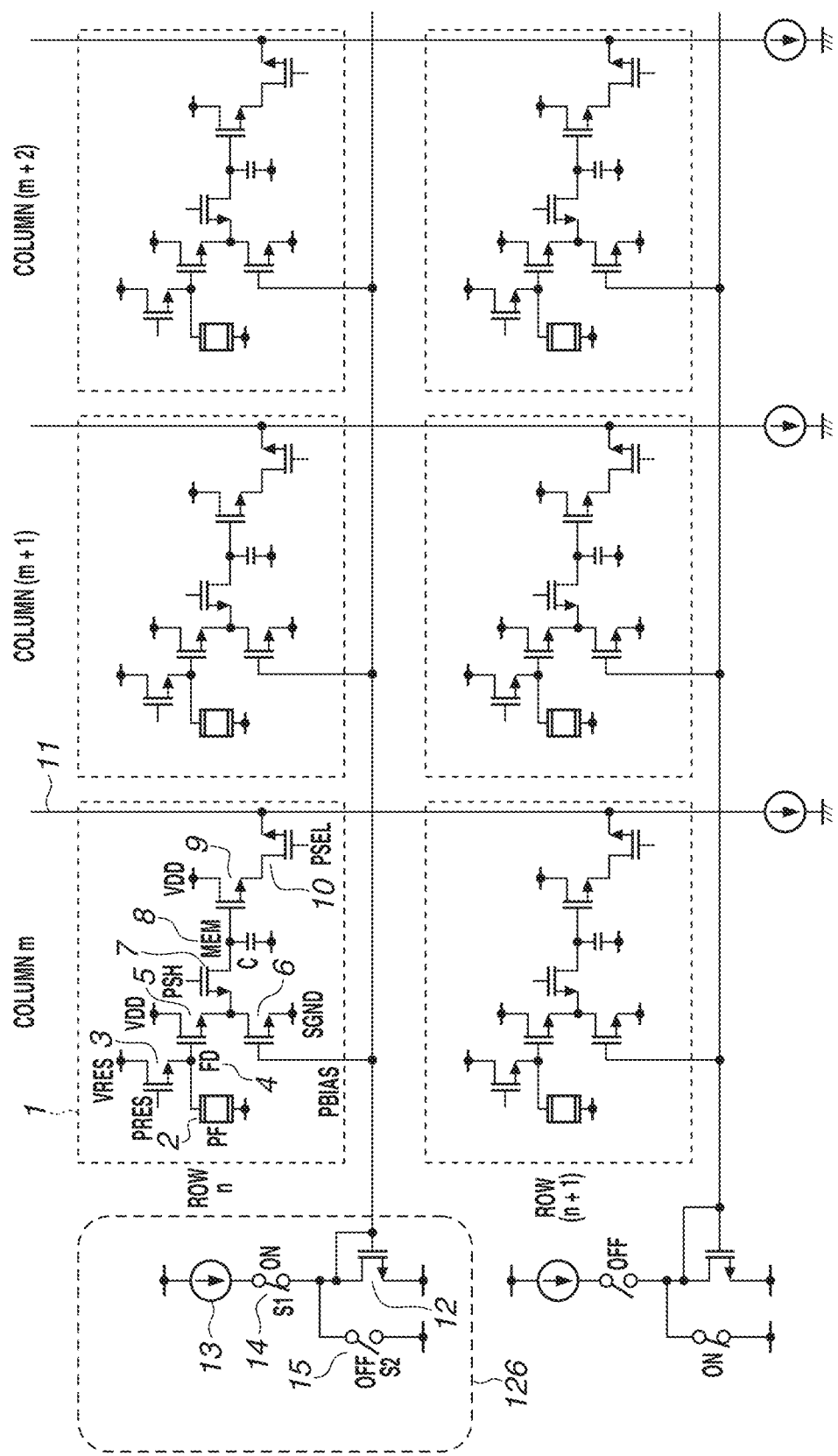
FIG. 2 is an equivalent circuit diagram illustrating the photoelectric conversion apparatus according to the first exemplary embodiment.

The photoelectric conversion unit 1 and the control unit 126 will be described below with reference to an equivalent circuit diagram in FIG. 2. FIG. 2 illustrates the control unit 126 and the photoelectric conversion units 1 disposed in two rows and three columns (rows n and n+1 and columns m, m+1, and m+2). Each circuit group in FIG. 2 includes a reset transistor 3, a sampling transistor 7, an amplification transistor 9, and a selection transistor 10 in addition to the amplification transistor 5 and the load transistor 6.

The photoelectric conversion element 2 included in the photoelectric conversion unit 1 is connected to a gate of the amplification transistor 5 (first amplification transistor) via a floating diffusion (FD) 4. The FD 4 is a first node. To the FD 4, a reset potential VRES is supplied via the reset transistor 3.

A source of the amplification transistor 5 is connected to a ground potential via the load transistor 6, which drives the amplification transistor 5. A drain of the amplification transistor 5 is connected to a reference potential VDD. The source of the amplification transistor 5 is connected to a gate of the amplification transistor 9 via the sampling transistor 7 and a memory (MEM) 8. The MEM 8 is a second node. A drain of the amplification transistor 9 is connected to a reference potential VDD. A source of the amplification transistor 9 is connected to an output line 11 via the selection transistor 10.

One end of a capacitor C is connected to the MEM 8. Another end of the capacitor C is connected to a reference potential, and the reference potential may be a ground potential. A control signal PRES is input to a gate of the reset transistor 3. A control signal PBIAS is input to a gate of the load transistor 6. A control signal PS is input to a gate of the sampling transistor 7. Further, a control signal PSEL is input to a gate of the selection transistor 10. In FIG. 1, the control unit 126 is disposed between the vertical scan circuit 122 and the sensing region 121.

The control unit 126 that controls the load transistor 6 will be described below. The control unit 126 includes a connection transistor 12, a reference current source 13, and a switch 14 (first switch). The connection transistor 12 has a gate and a drain connected together. The switch 14 controls the value of a current that is supplied to the connection transistor 12. The control unit 126 is disposed to each row. Specifically, the plurality of photoelectric conversion units 1 disposed in a row shares one control unit 126 corresponding to the row.

The gate of the connection transistor 12 of the control unit 126 is connected to each gate of the plurality of load transistors 6 disposed in one row. Specifically, the gates of the plurality of load transistors 6 in a row share the gate of the connection transistor 12 corresponding to the row.

For example, a first control unit is disposed correspondingly to the plurality of photoelectric conversion elements 2 disposed in a first row, and a second control unit is disposed correspondingly to the plurality of photoelectric conversion elements 2 disposed in a second row. Then, the gate of the connection transistor 12 of the first control unit is connected to each gate of the plurality of load transistors 6 corresponding to the plurality of photoelectric conversion elements 2 in the first row. The gate of the connection transistor 12 of the second control unit is connected to each gate of the plurality of load transistors 6 corresponding to the plurality of photoelectric conversion elements 2 in the second row.

The connection transistor 12 and the load transistor 6 constitute a current mirror circuit. The reference current source 13 supplies a current to the connection transistor 12, and therefore a gate voltage of the connection transistor 12 is determined. The gate voltage is applied as the control signal PBIAS to each gate of the plurality of load transistors 6 in the corresponding row. Consequently, a current corresponding to the current that flows in the connection transistor 12 flows in the plurality of load transistors 6 in the corresponding row. Then, the amplification transistor 5 is driven, and a signal voltage is output from the amplification transistor 5.

In the present exemplary embodiment, the reference current source 13 and the connection transistor 12 are connected to each other via the switch 14. The switch 14 controls the supply and interruption of the current from the reference current source 13 to the connection transistor 12. The switches 14 of the plurality of control units 126 in a column are sequentially controlled row by row by the vertical scan circuit 122 (control circuit) so that the current flows in the load transistors 6 of the row to be operated. In FIG. 2, the row to be operated is the nth row. The switch 14 that corresponds to the nth row is turned on so that the current is supplied from the reference current source 13 to the connection transistor 12 and the current flows in the plurality of load transistors 6 in the nth row. The switch 14 that corresponds to the (n+1)th row is turned off so that the current to the connection transistor 12 is interrupted and the current does not flow in the load transistors 6 of the photoelectric conversion units 1 in the (n+1)th row.

The first exemplary embodiment reduces power consumption significantly compared to a case where the current continuously flows in all the load transistors 6 without the switch 14. Furthermore, since the plurality of load transistors 6 disposed in the row direction shares the connection transistor 12, the number of elements of the photoelectric conversion unit 1 is reduced. Thus, the size of the photoelectric conversion apparatus 100 is reduced compared to the configuration discussed in Japanese Patent Application Laid-Open No. 2014-78869 in which the current source and the switch are disposed with respect to each photoelectric conversion element 2.

In FIG. 2, the control unit 126 includes a switch 15. The switch 15 applies a voltage for turning off the connection transistor 12 and the load transistor 6 to the gate. When the current from the reference current source 13 to the connection transistor 12 is interrupted with the switch 14, the switch 15 is turned on to forcibly interrupt the current. This reduces the time for interrupting the current to the load transistor 6, so that the response speed increases. One node of the switch 15 is connected to a ground potential. Thus, a voltage between the gate and the source of the connection transistor 12 and the load transistor 6 is 0 V. The voltage for turning off may not be the ground potential and can be any voltage by which the connection transistor 12 and the load transistor 6 are turned off. A timing to turn on the switch 15 is desirably the same timing as or after a timing to turn off the switch 14. If the current flows via the switch 15, the value of the current that flows in the connection transistor 12 often becomes unstable, and this can cause noise. However, noise is reduced by turning on the switch 15 at a timing described above.

The vertical scan circuit 122 outputs the control signal PRES for on/off control of the reset transistor 3, the control signal PSH, and the control signal PSEL for on/off control of the selection transistor 10. Further, the switches 14 and 15 are controlled by a control signal from the vertical scan circuit 122.

Figure 3:
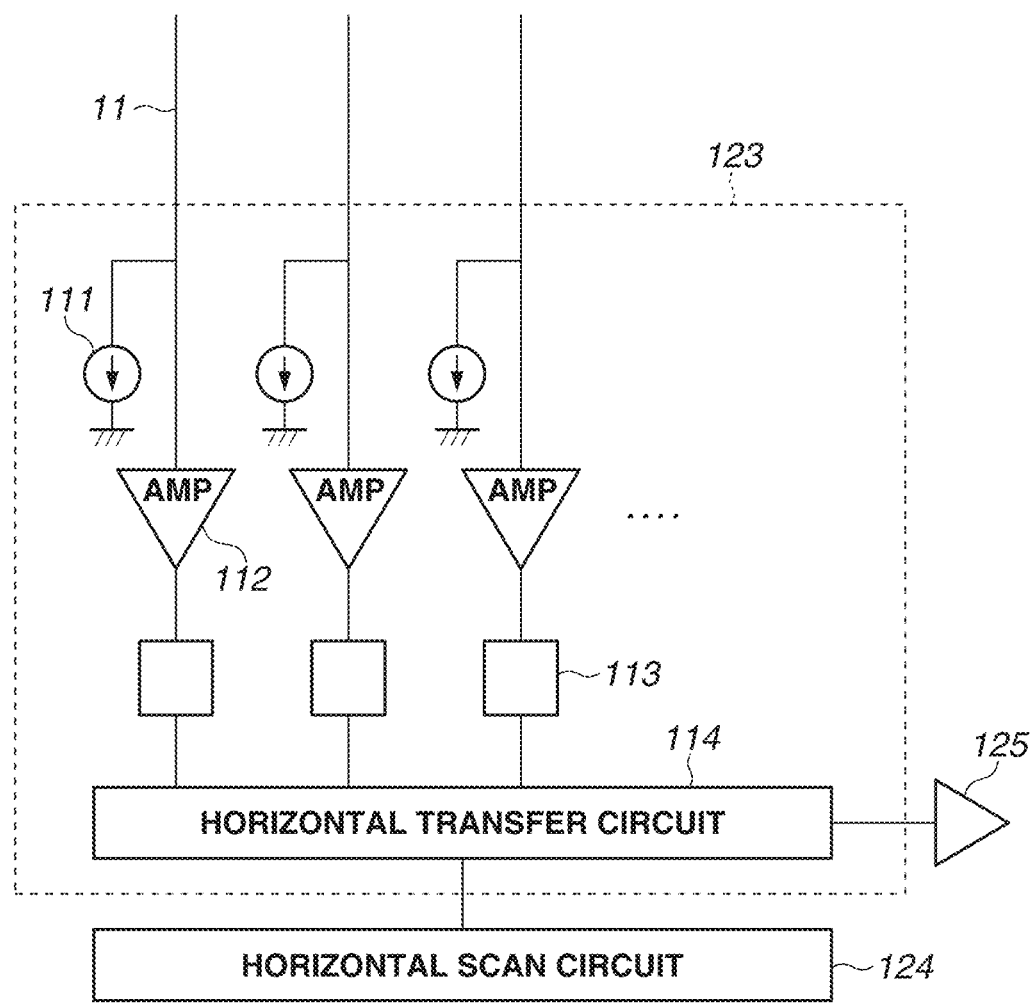
FIG. 3 is an equivalent circuit diagram illustrating a reading circuit according to the first exemplary embodiment.

FIG. 3 illustrates an example of a configuration of the reading circuit 123 illustrated in FIG. 1. In FIG. 3, the reading circuit 123 includes the output line 11, a reference current source 111, an amplification circuit 112 corresponding to the output line 11, a signal accumulation unit 113, and a horizontal transfer circuit 114. The reference current source 111 as a load unit of the amplification transistor 9 and the amplification circuit 112 are connected to the output line 11, and the signal accumulation unit 113 is connected to an output node of the amplification circuit 112.

The amplification circuit 112 amplifies S- and N-signals from the circuit group and outputs the amplified S- and N-signals to the signal accumulation unit 113. The signal accumulation unit 113 stores the S- and N-signals amplified by the amplification circuit 112. The S- and N-signals stored in the signal accumulation unit 113 are sequentially output column by column to the horizontal transfer circuit 114 by the horizontal scan circuit 124 and transmitted from the output circuit 125 to a signal processing circuit (not illustrated). The signal processing circuit generates a difference signal of the S- and N-signals. An analog digital conversion unit (not illustrated) may be disposed between the signal accumulation unit 113 and the horizontal transfer circuit 114.

As described above, the reference current source 13 controlling the load transistors 6 is disposed with respect to each row and the reference current source 111 as the load unit of the amplification transistor 9 is disposed with respect to each column in the photoelectric conversion apparatus 100 according to the first exemplary embodiment. The two types of reference current sources 13 and 111 are separately disposed along sides different from each other. In other words, in a planar view, the plurality of reference current sources 13 is disposed in a first direction (vertical direction in FIG. 1), whereas the plurality of reference current sources 111 orthogonal to the first direction is disposed in a second direction (horizontal direction in FIG. 1). In this way, the circuit region is efficiently arranged, and the size of the photoelectric conversion apparatus 100 is reduced.

FIG. 4 is a cross-sectional view illustrating a portion of the photoelectric conversion unit 1 of the photoelectric conversion apparatus 100 according to the first exemplary embodiment. The photoelectric conversion element 2 includes a first electrode 801, a photoelectric conversion layer 802, and a second electrode 803 disposed in this order. In FIG. 2, the photoelectric conversion layer 802 is held between the first electrode 801 and the second electrode 803. In the first exemplary embodiment, each photoelectric conversion element 2 is a region that includes one electrode 801. In other words, regions where different electrodes 801 are respectively disposed are different photoelectric conversion elements 2. Further, in the planar view, an outer edge of one photoelectric conversion element 2 is, for example, an outer edge of one electrode 801. Although not illustrated, the first electrode 801 and the FD 4 are connected. A color filter 40 and a microlens 41 may be disposed on a surface of the second electrode 803 that is on the opposite surface where the photoelectric conversion layer 802 is disposed.

The first electrode 801 is an electrode that is divided for each photoelectric conversion unit 1 and separates a charge generated in a region of the photoelectric conversion layer 802 and collects the separated charge. The photoelectric conversion layer 802 includes an organic or inorganic photoelectric conversion film that generates a charge corresponding to the amount of incident light.

The second electrode 803 is disposed to cover the photoelectric conversion layer 802. The second electrode 803 is an electrode that applies a voltage to the photoelectric conversion layer 802 to generate an electric field in the photoelectric conversion layer 802. Since the second electrode 803 is disposed closer to a light incident surface than the photoelectric conversion layer 802 is, the second electrode 803 is made of a conductive material that transmits incident light, such as indium tin oxide (ITO).

A functional layer such as a charge blocking layer that reduces or prevents injection of a charge into the photoelectric conversion layer 802 may be disposed between the photoelectric conversion layer 802 and the first electrode 801 or between the photoelectric conversion layer 802 and the second electrode 803.

All the transistors of the circuit group of the photoelectric conversion unit 1 are N-type metal oxide semiconductor transistors (N-type MOS transistors), and all the transistors of the photoelectric conversion unit 1 are disposed in a single P-type well 201. In FIG. 4, the amplification transistor 5 and the load transistor 6 are illustrated as the transistors of the circuit group of the photoelectric conversion unit 1. The connection transistor 12 disposed with respect to each row is an N-type MOS transistor, is manufactured by a similar process to a process by which the transistors of the circuit group of the photoelectric conversion unit 1 are manufactured, and is disposed in the P-type well 201 in which the circuit group is disposed. Specifically, the circuit group of the photoelectric conversion unit 1 and the connection transistor 12 share the P-type well 201. With this configuration, the current copy accuracy of the current mirror circuit including the connection transistor 12 and the load transistor 6 increases.

While one load transistor 6 and one amplification transistor 5 of the photoelectric conversion unit 1 are illustrated in FIG. 4, it is desirable to dispose the plurality of load transistors 6 and the plurality of amplification transistors 5 in a row in common in the P-type well 201. With this configuration, the currents in the current mirror circuits in the plurality of photoelectric conversion units 1 in a row become the same current.

The switch 14 is realized by a P-type MOS transistor and is disposed in an N-type well 202. The switch 15 is realized by an N-type MOS transistor and is disposed in a P-type well 203. The transistors of the vertical scan circuit 122 and the switches 14 and 15 are not always disposed in the well in which the circuit group of the photoelectric conversion unit 1 is disposed.

An impurity concentration of the source and the drain of the connection transistor 12 is desirably lower than an impurity concentration of the source and the drain of the transistor of the switch 14. An impurity concentration of the transistors of the photoelectric conversion unit 1 and the impurity concentration of the source and the drain of the connection transistor 12 are desirably lower than the impurity concentration of the source and the drain of the transistor of the vertical scan circuit 122, the impurity concentration of the source and the drain of the transistor of the first switch 14, and an impurity concentration of the source and the drain of the transistor of the second switch 15. A reason therefor is that defects that occur when impurities are doped are reduced and generation of dark current in, for example, the FD 4 is reduced or prevented. In order to increase an operation speed, it is desirable to increase the impurity concentrations of the transistors of the vertical scan circuit 122 and the switches 14 and 15 to decrease resistance so that driving performance is enhanced.

Figure 5A:
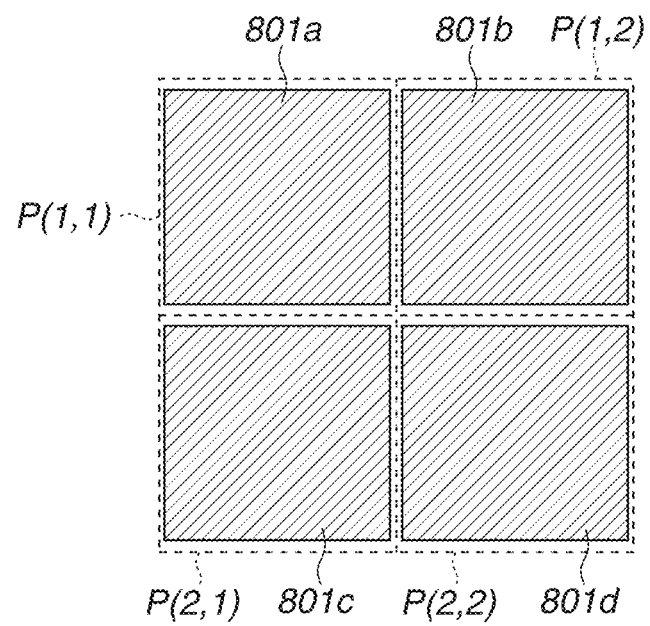
FIGS. 5A and 5B are plane views each illustrating a circuit of the photoelectric conversion apparatus according to the first exemplary embodiment.

Next, a planar positional relationship between the first electrode 801 of the photoelectric conversion element 2 and the circuit group that is connected to the first electrode 801 and included in the photoelectric conversion unit 1 will be described below with reference to FIGS. 5A and 5B. The first electrode 801 may be, but does not have to be, disposed directly above the circuit group. FIG. 5A illustrates an example of the photoelectric conversion units 1 disposed in two rows and two columns The photoelectric conversion units 1 at the respective positions are each denoted by P(x, y), where x is a row number, and y is a column number.

The first electrode 801a is disposed correspondingly to the photoelectric conversion unit P(1, 1), and the first electrode 801b is disposed correspondingly to the photoelectric conversion unit P(1, 2). The first electrode 801c is disposed correspondingly to the photoelectric conversion unit P(2, 1), and the first electrode 801d is disposed correspondingly to the photoelectric conversion unit P(2, 2).

Figure 5B:
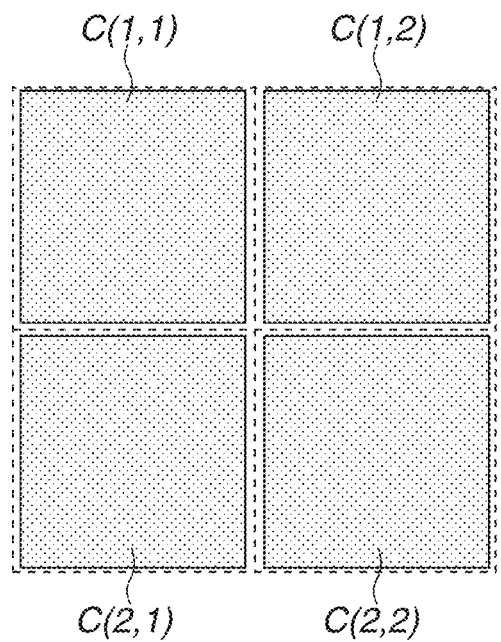

FIG. 5B illustrates the circuit groups of the photoelectric conversion units 1 that are disposed correspondingly to FIG. 5A. In FIG. 5B, the circuit groups are disposed in two rows and two columns The circuit groups at the respective positions are each denoted by C(x, y), where x is a row number, and y is a column number.

The number of the first electrodes 801 in FIG. 5A and the number of circuit groups in FIG. 5B are each four, and the first electrodes 801 and the circuit groups are respectively connected. For example, the first electrode 801a is connected to the circuit group C(1, 1). Further, the first electrodes 801c, 801b, and 801d are connected to the circuit groups C(2, 1), C(1, 2), and C(2, 2), respectively.

The size of the load transistor 6 of the current mirror circuit and the size of the connection transistor 12 will be described below with reference to FIG. 6. The load transistor 6 includes a gate 6G, a source 6S, and a drain 6D. The connection transistor 12 includes a gate 12G, a source 12S, and a drain 12D. When the switch 14 is turned on, the current from the reference current source 13 flows in the connection transistor 12, and the gate 6G of the load transistor 6 is charged by the current from the reference current source 13. Thus, if the current of the reference current source 13 is increased as much as possible, the charging time is reduced, and the response speed of an operation increases. Further, if the current that flows in the load transistor 6 is decreased, the current consumption decreases. Thus, a desirable width/length (W/L) ratio of the transistors is W2/L2>W1/L1, where W1 is a gate width of the load transistor 6, L1 is a gate length of the load transistor 6, W2 is a gate width of the connection transistor 12, and L2 is a gate length of the connection transistor 12. In view of the power consumption and layout area, W2/L2 is desirably 10 times to 100 times greater than W1/L1.

Figure 7:
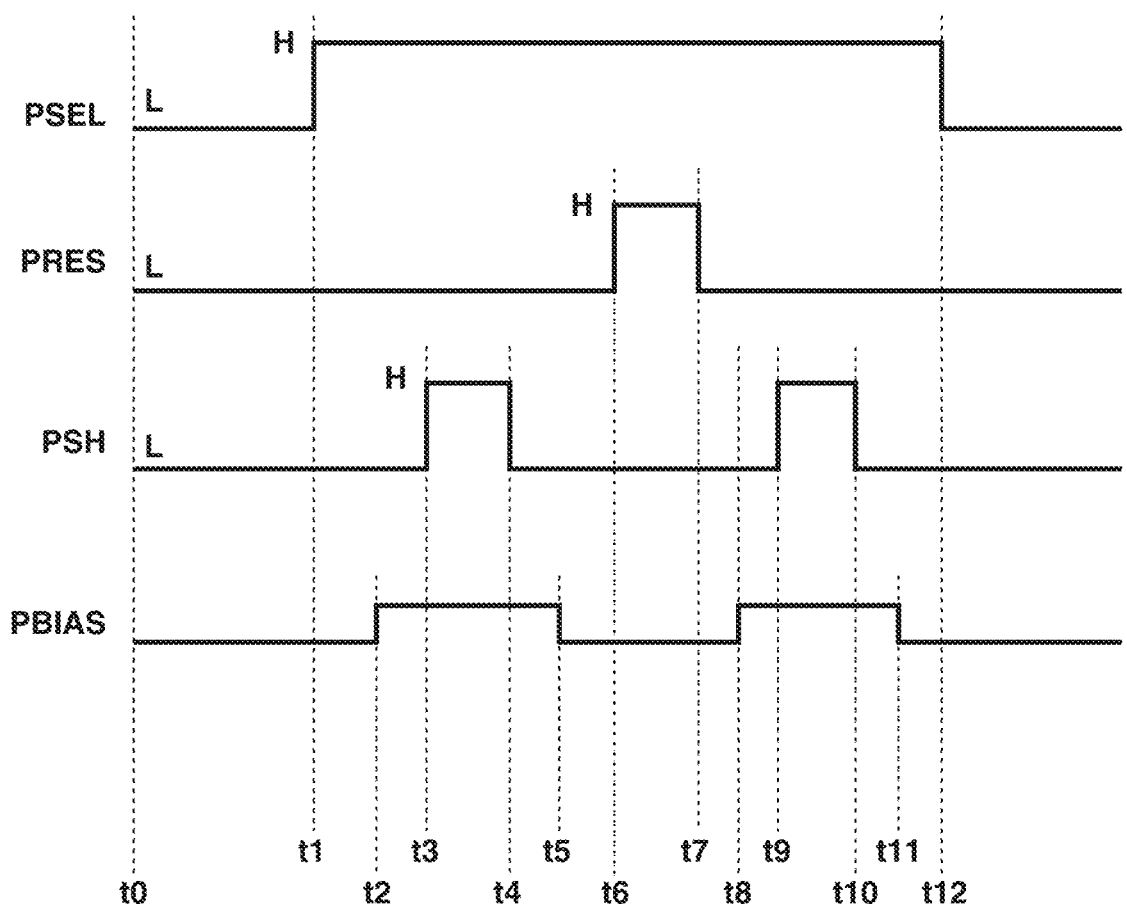
FIG. 7 is a view illustrating the driving of a pixel circuit according to the first exemplary embodiment.

The driving of the circuit group of the photoelectric conversion unit 1 illustrated in FIG. 2 will be described below with reference to FIG. 7. Time t0 is a predetermined time point at which charge accumulation is started.

At time t1, the control signal PSEL is changed from a low level (L-level) to a high level (H-level), and the selection transistor 10 is turned on. Consequently, a noise-level potential (N-signal) that is a potential corresponding to the MEM 8 is output to the output line 11 via the amplification transistor 9 and the selection transistor 10.

At time t2, the switch 14 is turned on, and the current is supplied to the connection transistor 12. A gate voltage of the connection transistor 12 that corresponds to the value of the current that flows at this time is applied as the control signal PBIAS to the gate of the load transistor 6 so that the current flows in the load transistor 6 and the amplification transistor 5 is changed to a driving state.

At time t3, the control signal PSH is changed from the L-level to the H-level, and the sampling transistor 7 is turned on. At time t4, the control signal PSH is changed from the H-level to the L-level, and the sampling transistor 7 is turned off. As a result of the above-described driving, a signal-level potential that corresponds to the charge accumulated in the FD 4 is output from the amplification transistor 5 and transferred to the MEM 8, and a signal-level potential (S-signal) that is a potential corresponding to the MEM 8 is output to the output line 11.

At time t5, the switch 14 is turned off, and the current to the connection transistor 12 is interrupted. Consequently, the current to the load transistor 6 is interrupted, and the amplification transistor 5 is changed to a non-driving state.

At time t6, the control signal PRES is changed from the L-level to the H-level, and the reset transistor 3 is turned on. Consequently, the reset potential VRES is written to the FD 4.

At time t7, the control signal PRES is changed from the H-level to the L-level, and the reset transistor 3 is turned off.

At time t8, the switch 14 is turned on, the current is supplied to the connection transistor 12, the current flows in the load transistor 6, and the amplification transistor 5 is changed to the driving state.

At time t9, the control signal PSH is changed from the L-level to the H-level, and the sampling transistor 7 is turned on. At time t10, the control signal PSH is changed from the H-level to the L-level, and the sampling transistor 7 is turned off. Consequently, the noise-level potential that is the potential corresponding to the FD 4 is transferred to the MEM 8. The noise-level potential is held in the holding capacitor C.

At time t11, the switch 14 is turned off, and the current to the connection transistor 12 is interrupted. Consequently, the current to the load transistor 6 is interrupted, and the amplification transistor 5 is changed to the non-driving state.

At time t12, the control signal PSEL is changed from the H-level to the L-level, and the selection transistor 10 is turned off. Consequently, charge accumulation is resumed. During the charge accumulation, the noise-level potential is held in the capacitor C.

As described above, in the driving of the circuit group according to the first exemplary embodiment, when the signal-level potential corresponding to the charged accumulated in the FD 4 is transferred to the MEM 8, the switch 14 is turned on so that the current flows in the load transistor 6 and the amplification transistor 5 is changed to the driving state. The driving state is maintained until the sampling transistor 7 is turned off. Specifically, after the sampling transistor 7 is turned off, the switch 14 is turned off to change the amplification transistor 5 to the non-driving state, and this operation prevents a failure of potential transfer to the MEM 8.

Figure 6:
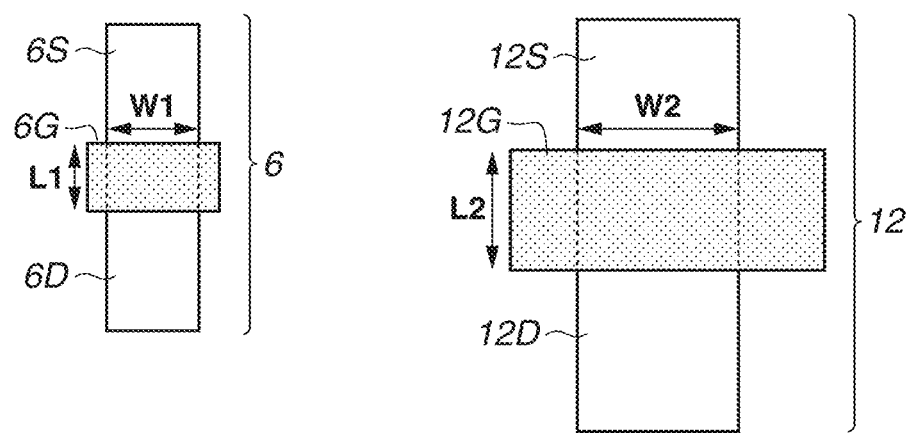
FIG. 6 is view illustrating a planar positional relationship between a first electrode and a circuit group according to the first exemplary embodiment.

While the switch 14 is off from time t5 to time t8 in FIG. 6, the switch 14 may be continuously on. Further, the switch 14 may be continuously on from time t1 to time t12.

Figure 8:
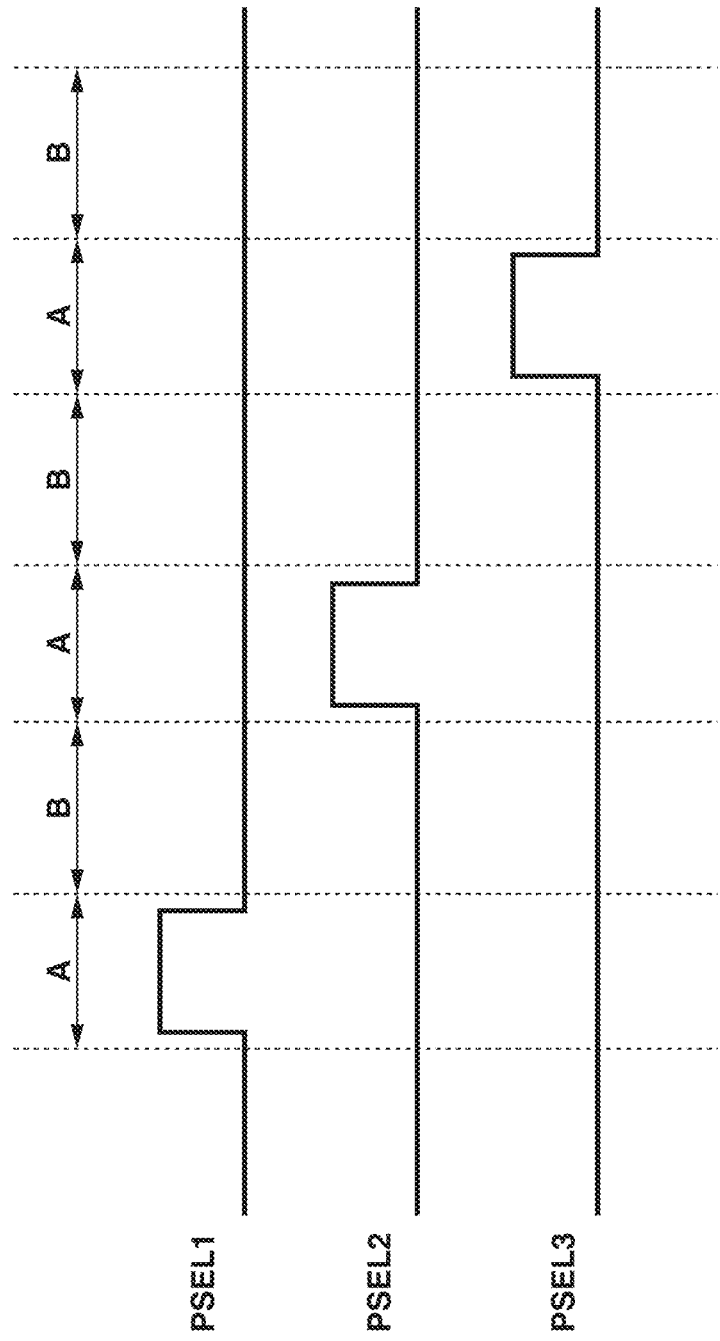
FIG. 8 is a view illustrating the driving of the photoelectric conversion apparatus according to the first exemplary embodiment.

FIG. 8 illustrates an operation of sequential row control on three rows. For simplification, only the control signal PSEL illustrated in FIG. 7 will be described below. The control signal PSEL that corresponds to the first row is referred to as "control signal PSEL1". The control signal PSEL that corresponds to the second row is referred to as "control signal PSEL2". The control signal PSEL that corresponds to the third row is referred to as "control signal PSEL3". Driving waveforms of the circuit group in FIG. 7 correspond to a period A. Specifically, the period A includes time t0 to time t12 in FIG. 7. As illustrated in FIG. 8, the control signals PSEL1, PSEL2, and PSEL3 are sequentially changed to the H-level, and a row is selected, and the S- and N-signals are read from the selected row.

In a period B following the period A, the S- and N-signals stored in the signal accumulation unit 113 of the reading circuit 123 are sequentially output column by column to the horizontal transfer circuit 114 and then output from the output circuit 125 to the signal processing circuit.

Figure 9:
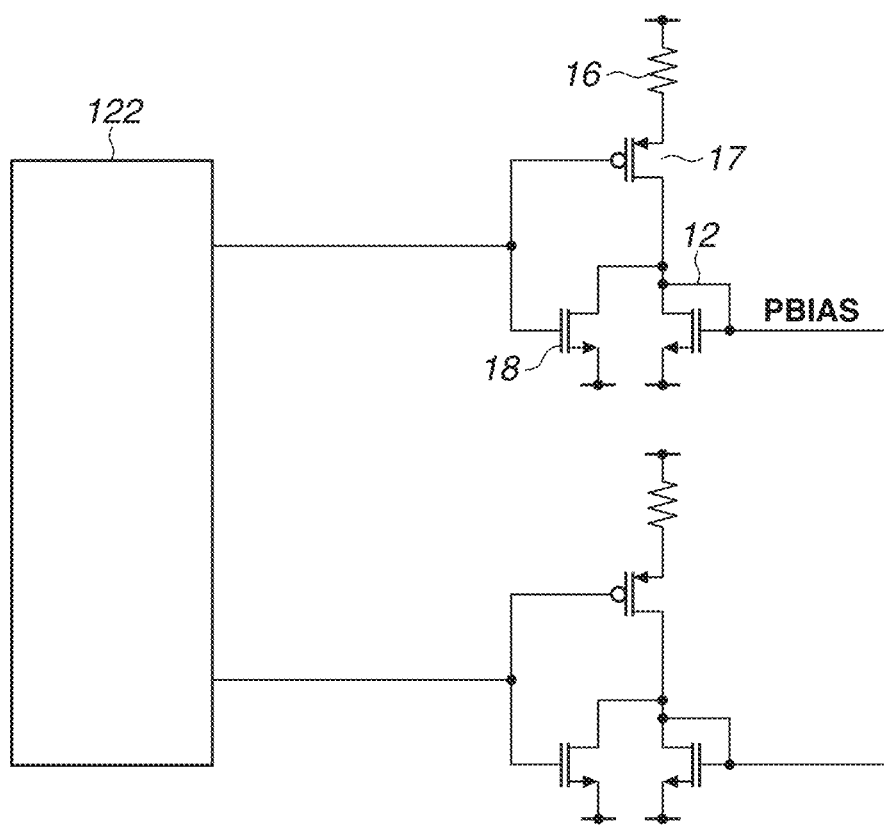
FIG. 9 is a configuration example illustrating a control circuit according to the first exemplary embodiment.

FIG. 9 illustrates a specific example of a configuration of the control unit 126 that controls the load transistor 6. For simplification, two rows of circuits are illustrated. A resistor 16 is used as a reference current source. A P-type MOS transistor 17 and an N-type MOS transistor 18 are used as the switches 14 and 15, respectively, and a control signal is input to a gate of the P-type MOS transistor 17 and to a gate of the N-type MOS transistor 18 to control the P-type MOS transistor 17 and the N-type MOS transistor 18 together. The control signal is output from the vertical scan circuit 122. In a case where the control signal is at the L-level, the P-type MOS transistor 17 is turned on, and the current is supplied to the connection transistor 12. Meanwhile, in a case where the control signal is at the H-level, a voltage is applied to the gates so that the P-type MOS transistor 17 is turned off to interrupt the current to the connection transistor 12 and the N-type MOS transistor 18 is turned on to turn off the load transistor 6.

The above-described configurations can be modified as described below.

While a photoelectric conversion layer is used as the photoelectric conversion element 2 in the above-described examples, a photodiode can be used as the photoelectric conversion element 2.

Further, the switch 15 is not an essential component, and the power consumption is reduced even in a case where the control unit 126 does not include the switch 15.

The switch 14 may control the value of the current that flows in the connection transistor 12. Specifically, the switch 14 may control not only the supply and interruption of the current and also the magnitude of the current value. In this case, the effect of reducing power consumption is less than that in the case where the supply and interruption of the current are controlled, but the power is still reduced.

The power consumption can be reduced even in a case where the circuit group does not include the MEM 8 and the control signal PSH.

The sensing region 121 and at least a portion of the circuit region are disposed at different substrates, and the substrates are layered. From the viewpoint of mirror properties, it is desirable to dispose at least the connection transistor 12 of the circuit region on the substrate on which the sensing region 121 is disposed. Forming the circuit region on different substrates reduces the area of the photoelectric conversion apparatus 100 in the planar view.

Figure 10:
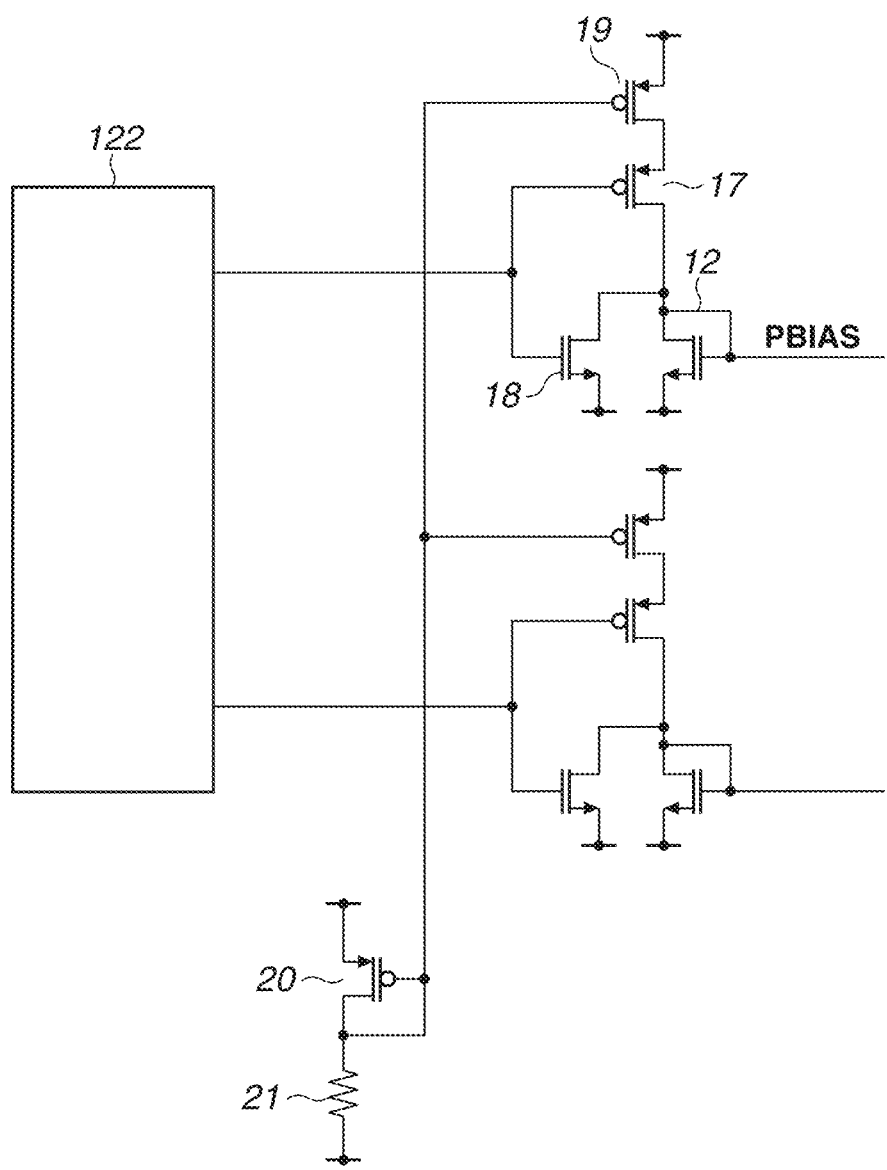
FIG. 10 is a configuration example illustrating another example of a configuration of the control circuit according to the first exemplary embodiment.

The control unit 126 may be configured as illustrated in FIG. 10. For simplification, two rows of circuits are illustrated. A P-type MOS transistor 19 is used as a reference current source. Gates of the P-type MOS transistors 19 each disposed correspondingly to a different one of the rows are connected together and are connected to a gate of a connection transistor 20, which is a P-type MOS transistor having a gate and a drain connected together. Specifically, the P-type MOS transistor 19 and the connection transistor 20 constitute a current mirror circuit. A resistor 21 is connected between the drain of the connection transistor 20 and a ground potential, and a current that flows is set based on the resistance value of the resistor 21. With the current mirror circuit as described above, current variations in the reference current sources between the rows are reduced or prevented. As in FIG. 9, the P-type MOS transistor 17 and the N-type MOS transistor 18 can be used as the switches 14 and 15, respectively, and a control signal output from the vertical scan circuit 122 is input to the P-type MOS transistor 17 and to the N-type MOS transistor 18 to perform control.

Figure 11A:
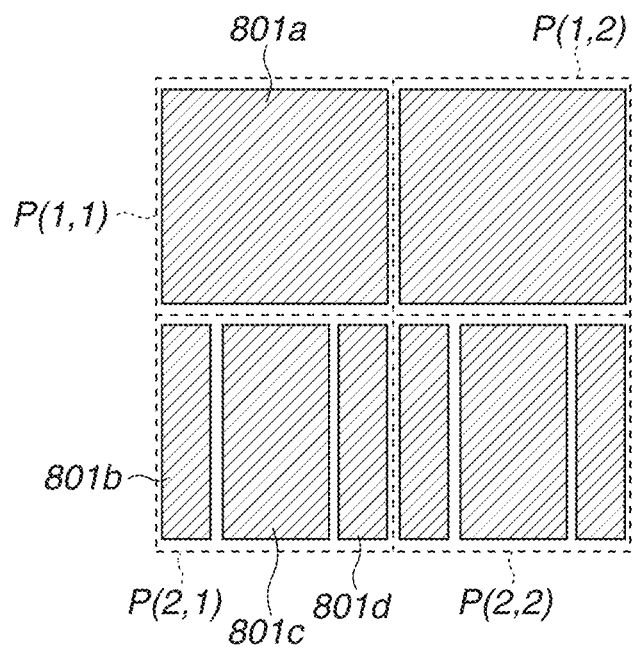
FIGS. 11A and 11B are schematic views each illustrating a photoelectric conversion apparatus according to a second exemplary embodiment.
Figure 11B:
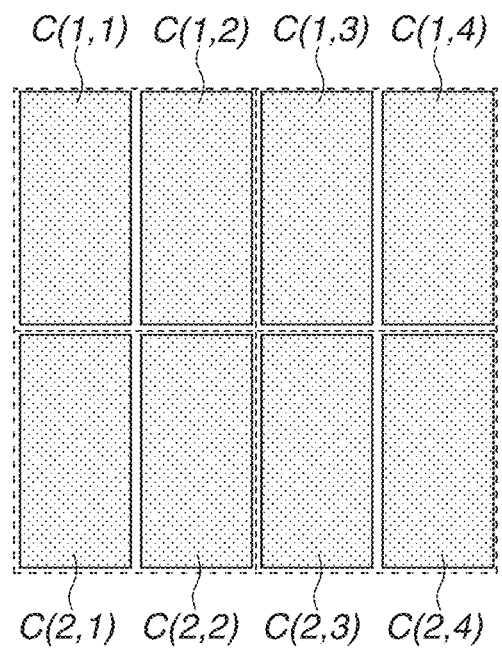

FIGS. 11A and 11B are planar views illustrating the first electrode 801 and the circuit group of a photoelectric conversion apparatus according to a second exemplary embodiment. The second exemplary embodiment is different from the first exemplary embodiment in that the photoelectric conversion units P having the first electrodes 801 that are different in area sizes are included.

As illustrated in FIGS. 11A and 11B, the first electrode 801a is disposed correspondingly to the photoelectric conversion unit P(1, 1). A similar first electrode 801 is disposed correspondingly to the photoelectric conversion unit P(1, 2) as in the case with the photoelectric conversion unit P(1, 1). The first electrodes 801b, 801c, and 801d are disposed correspondingly to the photoelectric conversion unit P(2, 1). The first electrode 801c is disposed between the first electrodes 801b and 801d. A similar first electrode 801 is disposed correspondingly to the photoelectric conversion unit P(2, 2) as in the case with the photoelectric conversion unit P(2, 1). In the photoelectric conversion units P(2, 1) and P(2, 2), one photoelectric conversion unit P includes three first electrodes 801. The sizes of the first electrodes 801 in the planar view can differ for each photoelectric conversion unit P as described above. For example, in a case where the photoelectric conversion apparatus is an image capturing apparatus, the photoelectric conversion apparatus may use a pixel as a pixel for capturing images while using another pixel as a pixel for ranging and capturing images. According to the present exemplary embodiment, the photoelectric conversion units P(1, 1) and P(1, 2) are used as pixels for image capturing and the pixels that include the first electrodes 801b, 801c, and 801d as a photoelectric conversion apparatus for ranging and image capturing. This enables the single image capturing apparatus to perform ranging while a decrease in image quality is prevented.

FIG. 11B illustrates the circuit groups of the photoelectric conversion unit 1 that are disposed correspondingly to FIG. 11A. In FIG. 11B, the circuit groups are disposed in two rows and four columns. The circuit group at each position is denoted by C(x, y), where x is a row number, and y is a column number.

The number of first electrodes 801 in FIG. 11A and the number of circuit groups C in FIG. 11B are each eight, and each of the first electrodes 801 and a different one of the circuit groups C are connected with each other. For example, the first electrode 801a is connected to the circuit group C(1, 1). The first electrode 801b is connected to the circuit group C(2, 1), the first electrode 801c is connected to the circuit group C(2, 2), and the first electrode 801d is connected to the circuit group C(1, 2). As described above, the row and column of the pixel circuit C(x, y) do not always match the row and column of the pixel P(x, y).

Figure 12:
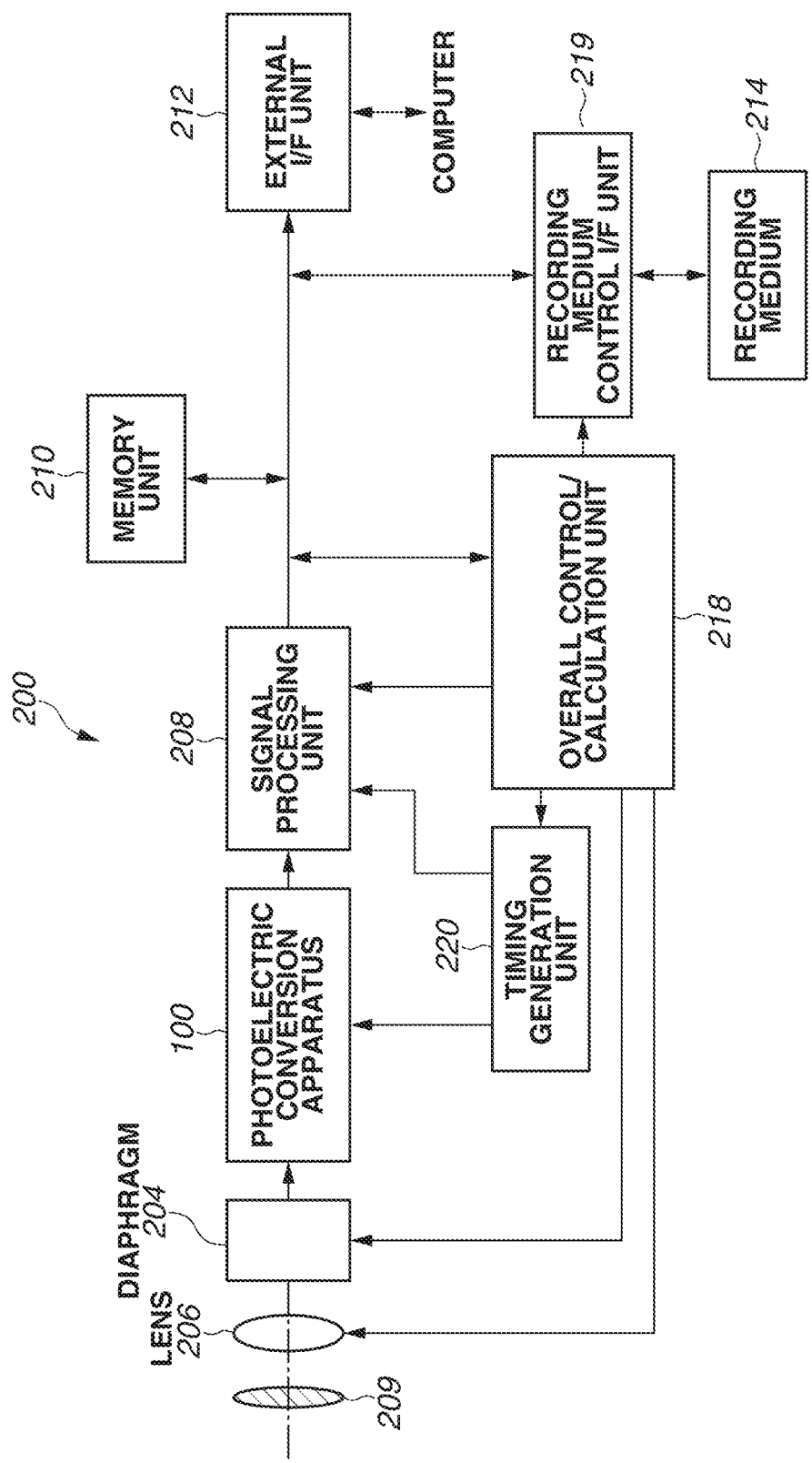
FIG. 12 is a block diagram illustrating a photoelectric conversion system according to a third exemplary embodiment.

A photoelectric conversion system according to a third exemplary embodiment will be described below with reference to FIG. 12. A component similar to that of the above-described photoelectric conversion apparatuses according to the exemplary embodiments is given the same reference numeral, and redundant description of the component is omitted or simplified. FIG. 12 is a block diagram illustrating a schematic configuration of the photoelectric conversion system according to the present exemplary embodiment.

Each photoelectric conversion apparatus according to any of the above-described exemplary embodiments is applicable as a photoelectric conversion apparatus 1001 illustrated in FIG. 12 to various photoelectric conversion systems. Examples of applicable photoelectric conversion systems include digital still cameras, digital camcorders, monitoring cameras, copying machines, facsimile machines, mobile phones, in-vehicle cameras, and observation satellites. Further, the photoelectric conversion systems also include a camera module that includes an optical system, such as a lens, and a photoelectric conversion apparatus. FIG. 12 is a block diagram illustrating a digital still camera as an example.

A photoelectric conversion system 200 illustrated in FIG. 12 as an example includes the photoelectric conversion apparatus 100, a lens 206, a diaphragm 204, and a barrier 209. The lens 206 forms an optical image of a subject on the photoelectric conversion apparatus 100. The diaphragm 204 varies the amount of light that passes through the lens 206. The barrier 209 protects the lens 206. The lens 206 and the diaphragm 204 are an optical system that focuses light onto the photoelectric conversion apparatus 100. The photoelectric conversion apparatus 100 is one of the photoelectric conversion apparatuses according to the above-described exemplary embodiments and converts the optical image formed by the lens 206 into image data.

The photoelectric conversion system 200 includes a signal processing unit 208 that processes an output signal output from the photoelectric conversion apparatus 100. The signal processing unit 208 performs AD conversion to convert an analog signal output from the photoelectric conversion apparatus 100 into a digital signal. Further, the signal processing unit 208 performs various operations such as correction and compression as needed and outputs the resulting image data. For example, the signal processing unit 208 performs white balance calculation processing on digital image data. The white balance of image data that is output from the photoelectric conversion apparatus 100 is adjusted by multiplying a signal value of each color signal corresponding to the image data by a predetermined white balance coefficient. An AD conversion unit is part of the signal processing unit 208 and may be formed on a semiconductor substrate on which the photoelectric conversion apparatus 100 is formed or on another semiconductor substrate different from the semiconductor substrate on which the photoelectric conversion apparatus 100 is formed. Alternatively, the photoelectric conversion apparatus 100 and the signal processing unit 208 may be formed on the same semiconductor substrate.

The photoelectric conversion system 200 further includes a memory unit 210 and an external interface unit (external I/F unit) 212. The memory unit 210 temporarily stores image data, and the external I/F unit 212 communicates with an external computer. The photoelectric conversion system 200 further includes a recording medium 214 for recording and reading captured image data, such as a semiconductor memory, and a recording medium control interface unit (recording medium control I/F unit) 219 that records data to and reads data from the recording medium 214. The recording medium 214 may be built in the photoelectric conversion system 200 or may be a removable recording medium.

The photoelectric conversion system 200 further includes an overall control/calculation unit 218 and a timing generation unit 220. The overall control/calculation unit 218 comprehensively controls various calculations and the entire digital still camera. The timing generation unit 220 outputs various timing signals to the photoelectric conversion apparatus 100 and the signal processing unit 208. Alternatively, the timing signals may be input externally, and the photoelectric conversion system 200 includes at least the photoelectric conversion apparatus 100 and the signal processing unit 208 that processes an output signal output from the photoelectric conversion apparatus 100.

Figure 13A:
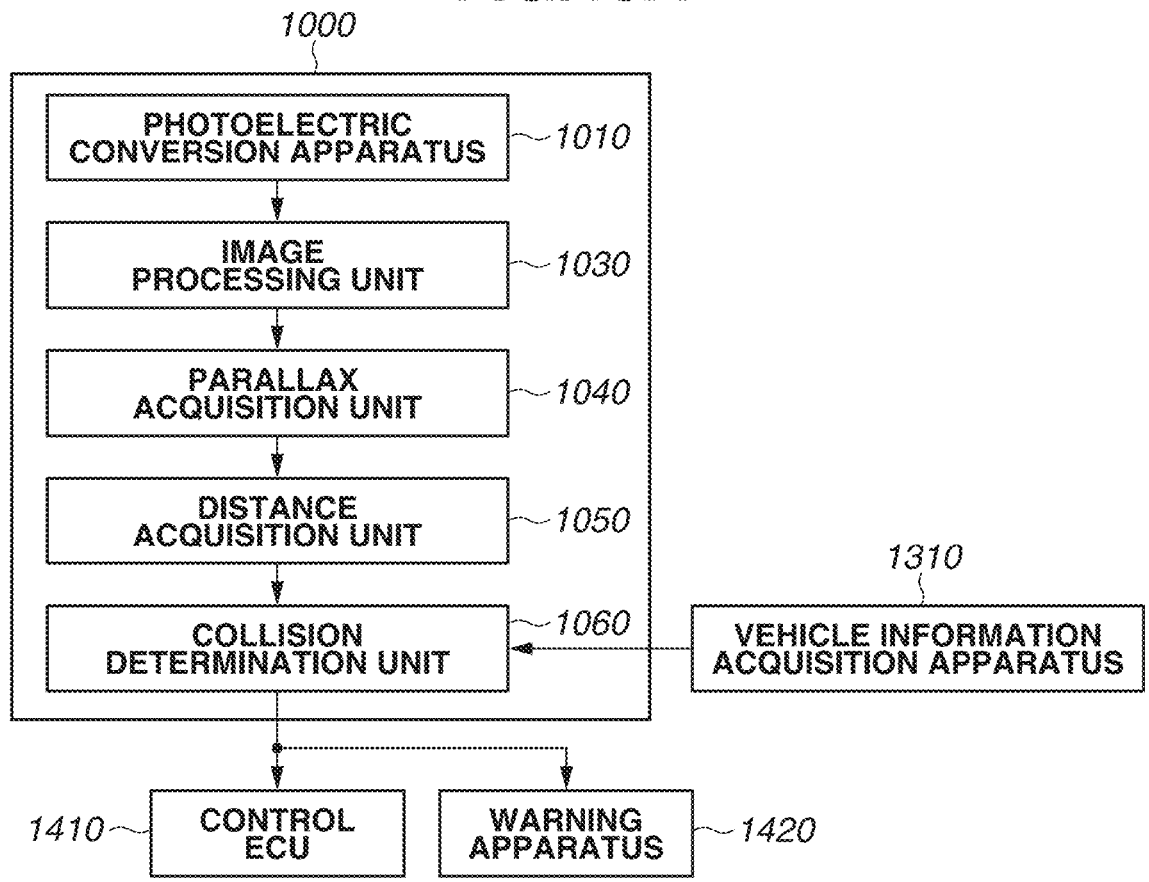
FIGS. 13A and 13B are diagrams illustrating a configuration example of a moving object according to a fourth exemplary embodiment.

FIG. 13A illustrates an example of a photoelectric conversion system that relates to an in-vehicle camera according to a fourth exemplary embodiment. A photoelectric conversion system 1000 is a photoelectric conversion system that includes the photoelectric conversion apparatus according to any of the above-described exemplary embodiments as a photoelectric conversion apparatus 1010. The photoelectric conversion system 1000 further includes an image processing unit 1030 and a parallax acquisition unit 1040. The image processing unit 1030 performs image processing on a plurality of pieces of image data acquired by the photoelectric conversion apparatus 1010. The parallax acquisition unit 1040 acquires a parallax (phase difference in parallax image) from the plurality of pieces of image data acquired by the photoelectric conversion system 1000. The parallax acquisition is performed using a signal read from the divided electrodes of the photoelectric conversion apparatus.

The photoelectric conversion system 1000 further includes a distance acquisition unit 1050 and a collision determination unit 1060. The distance acquisition unit 1050 acquires distance information about a distance to a target object based on the acquired parallax information. The collision determination unit 1060 determines a possibility of collision based on the acquired distance. The parallax acquisition unit 1040 and the distance acquisition unit 1050 are an example of a distance information acquisition unit that acquires distance information about a distance to a target object. Specifically, the distance information is information about a parallax, a defocus amount, and a distance to a target object. The collision determination unit 1060 determines a possibility of collision using any of the pieces of distance information. The distance information acquisition unit is realized by dedicated hardware or a software module or a combination thereof. The distance information acquisition unit is also realized by a field-programmable gate array (FPGA) or an application-specific integrated circuit (ASIC). The distance information acquisition unit is also realized by a combination of a FPGA and an ASIC.

The photoelectric conversion system 1000 is connected to a vehicle information acquisition apparatus 1310 and acquires vehicle information such as a vehicle speed, yaw rate, and rudder angle. Further, the photoelectric conversion system 1000 is connected to a control engine control unit (ECU) 1410. The control ECU 1410 is a control apparatus that outputs a control signal for generating a braking force with respect to the vehicle based on the result of determination by the collision determination unit 1060. Further, the photoelectric conversion system 1000 is also connected to a warning apparatus 1420. The warning apparatus 1420 provides a warning to the driver based on the result of determination by the collision determination unit 1060. For example, in a case where the collision determination unit 1060 determines that the possibility of collision is high, the control ECU 1410 controls the vehicle to avoid collision and prevent damage by applying a brake, releasing an accelerator, and/or reducing engine output. The warning apparatus 1420 warns the user by producing a warning sound, displaying warning information on a screen of a car navigation system, and/or vibrating a seatbelt or a steering.

In the present exemplary embodiment, the photoelectric conversion system 1000 captures an image around the vehicle, e.g., the front or the back.

Figure 13B:
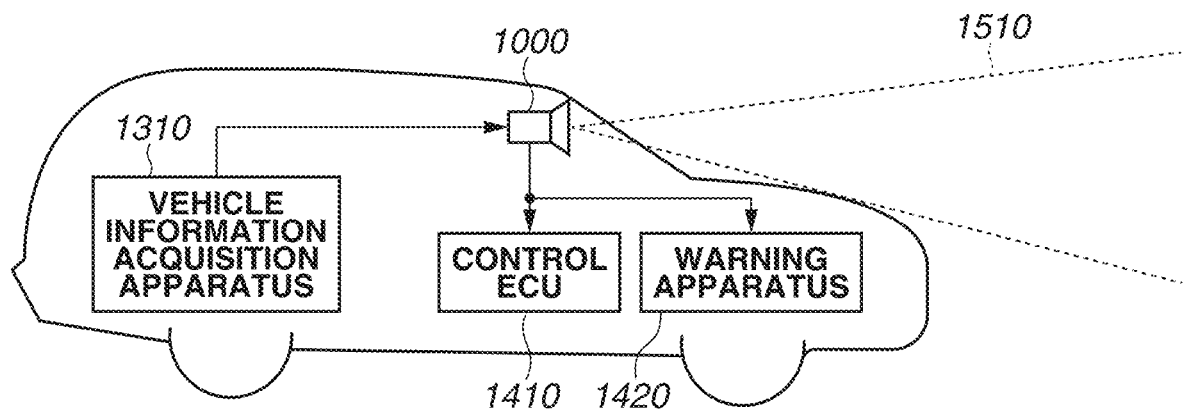

FIG. 13B illustrates an image capturing system that captures an image of the front of a vehicle. Further, while the control that is performed to avoid collision with another vehicle is described above, the present disclosure is also applicable to the control that is performed to automatically drive to follow another vehicle and the control that is performed to automatically drive not to drift from a lane. Further, the image capturing system is applicable to not only a vehicle but also a moving object (moving apparatus) such as a ship, an aircraft, or an industrial robot. The present disclosure is also applicable to not only a moving object but also a device that extensively uses object recognition, such as an intelligent transportation system (ITS).

The present disclosure is not limited to the above-described exemplary embodiments and various modifications can be made. For example, a modification that adds a portion of a configuration according to any of the above-described exemplary embodiments to another exemplary embodiment and a modification that replaces a portion of a configuration according to any of the above-described exemplary embodiments with a portion of a configuration according to another exemplary embodiment are also exemplary embodiments of the present disclosure. Further, the above-described modified examples of the first exemplary embodiment are applicable to the second exemplary embodiment.

The present disclosure realizes size reduction while reducing power consumption of a photoelectric conversion apparatus.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-097164, filed May 23, 2019, which is hereby incorporated by reference herein in its entirety.

What is claimed is:

1. A photoelectric conversion apparatus comprising:
a plurality of photoelectric conversion units disposed in a row direction and a column direction,
wherein each of the plurality of photoelectric conversion units includes a photoelectric conversion element, a first amplification transistor configured to output a signal voltage based on a charge of the photoelectric conversion element, and a load transistor configured to supply a current to the first amplification transistor,
wherein a first control unit is disposed correspondingly to the plurality of photoelectric conversion elements disposed in a first row,
wherein a second control unit is disposed correspondingly to the plurality of photoelectric conversion elements disposed in a second row,
wherein each of the first control unit and the second control unit includes:
a connection transistor including a gate and a drain connected to the gate;
a reference current source connected to the connection transistor and configured to supply the current of the load transistor; and
a first switch connected to the connection transistor and the reference current source and configured to control a current value of a current flowing in the connection transistor,
wherein the gate of the connection transistor of the first control unit is connected to each gate of the plurality of load transistors corresponding to the plurality of photoelectric conversion elements disposed in the first row, and
wherein the gate of the connection transistor of the second control unit is connected to each gate of the plurality of load transistors corresponding to the plurality of photoelectric conversion elements disposed in the second row.

2. The photoelectric conversion apparatus according to claim 1, wherein the first switch is connected to the reference current source and the drain of the connection transistor.

3. The photoelectric conversion apparatus according to claim 2, wherein the first switch controls supply and interruption of the current flowing in the connection transistor.

4. The photoelectric conversion apparatus according to claim 1, wherein the connection transistor and the load transistor constitute a current mirror circuit.

5. The photoelectric conversion apparatus according to claim 4, wherein a first semiconductor region of a first conductivity-type serves as a source and a drain of the load transistor, the first semiconductor region of the first conductivity-type being a region where a carrier having a first polarity that is the same as a polarity of a signal charge is a majority carrier, and a second semiconductor region of the first conductivity-type serves as a source and the drain of the connection transistor, and the source and the drain of the load transistor and the source and the drain of the connection transistor are disposed in common in a well that is a third semiconductor region of a second conductivity-type where a carrier having a second polarity is a majority carrier.

6. The photoelectric conversion apparatus according to claim 5, wherein the first semiconductor region of each load transistor of the plurality of photoelectric conversion elements disposed in the row direction is disposed in the well.

7. The photoelectric conversion apparatus according to claim 5,
wherein the first switch is a transistor including a source and a drain that are a fourth semiconductor region of the first conductivity-type, and
wherein the fourth semiconductor region has an impurity concentration higher than an impurity concentration of the first semiconductor region.

8. The photoelectric conversion apparatus according to claim 4, wherein each of the plurality of photoelectric conversion units includes:
an accumulation unit configured to accumulate the charge from the photoelectric conversion element;
a capacitor configured to hold the signal voltage output from the first amplification transistor; and
a second amplification transistor configured to output the signal voltage held in the capacitor.

9. The photoelectric conversion apparatus according to claim 8, wherein the plurality of second amplification transistors disposed correspondingly to the plurality of photoelectric conversion elements disposed in the column direction shares a second reference current source.

10. The photoelectric conversion apparatus according to claim 9,
wherein a plurality of the reference current sources is disposed in the row direction, and
wherein a plurality of the second reference current sources is disposed in the column direction.

11. The photoelectric conversion apparatus according to claim 8, further comprising a third switch configured to connect an output of the first amplification transistor to the capacitor,
wherein the first switch is turned off after the third switch is turned off.

12. The photoelectric conversion apparatus according to claim 11, wherein the photoelectric conversion element includes a first electrode, a photoelectric conversion film, and a second electrode in this order.

13. The photoelectric conversion apparatus according to claim 1, further comprising a control circuit configured to control sequentially turning on of the first switches of the plurality of control units row by row.

14. The photoelectric conversion apparatus according to claim 13, wherein the control circuit controls the current value of the connection transistor of the first control circuit and the current value of the connection transistor of the second control circuit to differ between the current values during a period.

15. The photoelectric conversion apparatus according to claim 14,
wherein the plurality of photoelectric conversion units is disposed in a sensing region, and
wherein the control unit is disposed in a region that does not overlap the sensing region in a planar view.

16. The photoelectric conversion apparatus according to claim 1, wherein the control unit includes a second switch configured to apply a voltage for turning off the connection transistor to the gate of the connection transistor.

17. The photoelectric conversion apparatus according to claim 1, wherein a ratio between a gate width and a gate length of the connection transistor is higher than a ratio between a gate width and a gate length of the load transistor.

18. A photoelectric conversion system comprising:
the photoelectric conversion apparatus according to claim 1; and
a signal processing unit configured to process a signal output from the photoelectric conversion apparatus.

19. A moving object comprising:
the photoelectric conversion apparatus according to claim 1; and
a distance information acquisition unit configured to acquire distance information about a distance to a target object from a parallax image based on a signal from the photoelectric conversion apparatus; and
a control unit configured to control the moving object based on the distance information.

* * * * *